United States Patent [19]

Durham

[11] Patent Number: 4,806,458

[45] Date of Patent: Feb. 21, 1989

[54] COMPOSITION CONTAINING A MIXTURE OF HEXA-ALKYL DISILAZANE AND PROPYLENE GLYCOL ALKYL ETHER AND/OR PROPYLENE GLYCOL ALKYL ETHER ACETATE

[75] Inventor: Dana Durham, Bloomsbury, N.J.

[73] Assignee: Hoechst Celanese Corporation, Somerville, N.J.

[21] Appl. No.: 64,969

[22] Filed: Aug. 27, 1987

Related U.S. Application Data

[62] Division of Ser. No. 791,876, Oct. 28, 1985, Pat. No. 4,692,398.

[51] Int. Cl.$^4$ .............................................. G03C 5/00
[52] U.S. Cl. .................................... 430/331; 430/149; 430/154; 430/169; 430/302; 430/309; 430/329
[58] Field of Search ............... 430/331, 329, 149, 169, 430/302, 309, 154

[56] References Cited

U.S. PATENT DOCUMENTS

| | | | |
|---|---|---|---|
| 3,228,768 | 1/1966 | Straw et al. | 96/49 |
| 3,520,683 | 7/1970 | Kerwin | 430/329 |
| 3,549,368 | 12/1970 | Collins et al. | 430/272 |
| 3,666,473 | 5/1972 | Colom et al. | 430/192 |
| 3,859,099 | 1/1975 | Petropoulos et al. | 96/33 |
| 3,868,254 | 2/1975 | Wemmers | 96/75 |
| 3,869,292 | 3/1975 | Peters | 96/115 R |
| 3,882,038 | 5/1975 | Clayton et al. | 134/38 |
| 3,933,517 | 1/1976 | Vivian | 252/171 |
| 4,308,368 | 12/1981 | Kubo et al. | 430/192 |
| 4,351,895 | 9/1982 | Walls | 430/331 |
| 4,355,094 | 10/1982 | Pampalone et al. | 430/286 |
| 4,378,423 | 3/1983 | Suezawa et al. | 430/303 |
| 4,381,340 | 4/1983 | Walls | 430/331 |
| 4,397,937 | 8/1983 | Cleeck et al. | 430/192 |
| 4,403,029 | 9/1983 | Ward et al. | 430/331 |
| 4,409,317 | 10/1983 | Shiraishi | 430/270 |
| 4,411,983 | 10/1983 | Washizawa et al. | 430/331 |
| 4,416,976 | 11/1983 | Schnell | 430/331 |
| 4,439,516 | 3/1984 | Cerrigliaro et al. | 430/192 |
| 4,460,674 | 7/1984 | Uehara et al. | 430/192 |
| 4,482,661 | 11/1984 | Liu | 524/906 |
| 4,550,069 | 10/1985 | Pampalone | 430/165 |
| 4,552,908 | 11/1985 | Nicks et al. | 523/504 |
| 4,592,787 | 6/1986 | Johnson | 134/38 |
| 4,609,614 | 9/1986 | Pampalone et al. | 430/166 |

OTHER PUBLICATIONS

Chemical Abstracts—vol. 86: 54765x.
Chemical Abstracts, vol. 89: 107342c.
Chemical Abstracts, vol. 94: 83268h.
Chemical Abstracts, vol. 94: 44370d.

*Primary Examiner*—Charles L. Bowers, Jr.
*Attorney, Agent, or Firm*—Richard S. Roberts

[57] ABSTRACT

The invention provides a composition which comprises from about 3 to about 50% by weight of a hexa-alkyl disilazane and a solvent composition which comprises one or more compounds selected from the group consisting of a propylene glycol alkyl ether and a propylene glycol alkyl ether acetate.

10 Claims, No Drawings

COMPOSITION CONTAINING A MIXTURE OF HEXA-ALKYL DISILAZANE AND PROPYLENE GLYCOL ALKYL ETHER AND/OR PROPYLENE GLYCOL ALKYL ETHER ACETATE

This is a divisional of co-pending application Ser. No. 06/791,876 filed on Oct. 28, 1985, U.S. Pat. No. 4,692,398.

BACKGROUND OF THE INVENTION

The present invention relates generally to the field of radiation sensitive positive and negative photoresist compositions and particularly to compositions containing novolak resins together with naphthoquinone diazide sensitizing agents.

It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas.

The relief pattern of photoresist on substrate produced by the method described above is useful for various applications including, for example, as an exposure mask or a pattern such as is employed in the manufacture of miniaturized integrated electronic components. In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

This invention relates to a composition for stripping, thinning, cleaning and promoting the adhesion of cured and uncured photoresist compositions on substrates covered with such resists and to the stripping process using such compositions.

Both mechanical and chemical processes are known for the removal of the aforementioned resinous coatings from a substrate, but these processes leave much to be desired. If the cured coating is mechanically stripped as by scraping, the removal of the material is almost invariable accompanied by some physical damage. The use of certain chemical reagents or solvents, formerly employed, is unsatisfactory since they dissolve the cured resins either too slowly or incompletely or both, or they comprise the electrical reliability by leaving residual contaminants which are not completely removed by subsequent processing. A solvent or stripping solution which will both quickly and completely remove the aforementioned cured resins from the substrates without damage or contamination thereof is therefore needed.

Solvent compositions are known which may be used for thinning photoresist compositions, stripping undesired cured and uncured photoresist from wafers, removing undesired edge bead from spun photoresist wafers and cleaning related photoresist processing equipment. However, such compositions are generally extremely toxic, ecologically undesirable and/or are unpleasantly odorous.

The present invention seeks to solve the aforementioned disadvantages.

A positive working photoresist comprising propylene glycol alkyl ether acetate is described in U.S. patent application Ser. No. 619,468 filed June 11, 1984, as well as U.S. patent application Ser. No. 791,252, filed on Oct. 25, 1985, and which are incorporated herein by reference.

A positive working photosensitive composition comprising a mono $C_1$ to $C_4$ alkyl glycol ether of 1,2 propanediol is described in U.S. Pat. No. 742,063 filed June 6, 1985 and is incorporated herein by reference.

A positive working photosensitive composition comprising a mixture of propylene glycol alkyl ether acetate and propylene glycol alkyl ether is described in U.S. patent application Ser. No. 791,880, filed on Oct. 25, 1985 and is incorporated herein by reference.

Photoresist treating compositions containing only one of propylene glycol alkyl ether and propylene glycol alkyl ether acetate have a disadvantage. Propylene glycol monomethyl ether acetate (PGMEA) has an offensive odor to approximately one-half the people who came in contact with it. These are usually women. Propylene glycol monomethyl ether (PGME) is also offensive to approximately one-half the people who are exposed to it. These are usually men. However, those who find PGMEA offensive find PGME to have little or no odor. The reverse is also true, those who object to PGME find PGMEA to be pleasant or not objectionable. Mixtures of these solvents i.e. PGME/PGMEA (1:1) are not objectionable, or at least less objectionable to both groups of individuals. Based on these observations photoresist treating compositions using PGME/PGMEA mixtures form a class of reduced odor compositions.

SUMMARY OF THE INVENTION

The invention provides a composition which comprises from about 3 to about 50% by weight of a hexaalkyl disilazane and a solvent composition which comprises one or more compounds selected from the group consisting of a propylene glycol alkyl ether and a propylene glycol alkyl ether acetate.

The invention also provides a method of treating a photographic composition which comprises contacting said composition with a mixture which comprises from about 3 to about 50% by weight of a hexa-alkyl disilazane and a solvent composition which comprises one or more compounds selected from the group consisting of a propylene glycol alkyl ether and a propylene glycol alkyl ether acetate.

Most preferably the acetate is propylene glycol methyl ether acetate. The most preferred ether is propylene glycol methyl ether. Both the ether and acetate preferably contain $C_1$ to $C_4$ alkyl units.

DETAILED DESCRIPTION OF THE PREFERRED EMBODIMENT

In the production of photoresists, preferably positive working photoresists, the skilled artisan provides a photosensitive composition containing a novolak or polyvinyl phenol resin, a quinone diazide photosensitizer and a solvent composition.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, New York, 1979 in Chapter 4 which is incorporated herein by reference. Polyvinyl phenols are described in U.S. Pat. Nos. 3,869,292 and 4,439,516, which are incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers are selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone(1,2)-diazide-5-sulfonyl chloride, and naphthoquinone-(1,2)-diazide-4-sulfonyl chloride condensed with phenolic compounds such as hydroxy benzophenones.

The solid parts of the photoresist composition, that is the resin and diazide ranges from 15% to about 99% resin and from about 1% to about 85% quinone diazide. In manufacturing the resist composition the resin and diazide are mixed with a solvent composition comprising, for example, xylene, butyl acetate and Cellosolve acetate in amounts from about 40% to about 90% by weight of the overall resist composition.

In the preferred embodiment, the hexa-alkyl disilazane is hexa-methyl disilazane. It is preferably present in the present composition in an amount ranging from about 3-50% by weight or more preferably 5-30% by weight.

The solvent composition comprising propylene glycol alkyl ether (PGME) and propylene glycol alkyl ether acetate (PGMEA) is preferably present in an amount ranging from about 50% to 97% by weight or more preferably 70% to 95%. Other solvents may also be included but these are not preferred.

In the preferred embodiment the ratio of PGME to PGMEA can vary in a broad range depending on the desires of the user. One suitable range of such ratios is from about 1:10–10:1. A preferred range is from about 7:3–3:7, more preferably about 6:4–4:6. In the most preferred embodiment the PGME and PGMEA are present in approximately a 1:1 ratio.

Additives such as colorants, dyes, anti-striation agents, plasticizers, adhesion promoters, speed enhancers, solvents and such surfactants as non-ionic surfactants may be added to the solution of resin, sensitizer and solvent composition before the solution is coated onto a substrate.

The prepared resist solution, is applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures. When the photoresist is whirl coated on a wafer substrate there is a tendency for a bead of photoresist to accumulate on the wafer edge. The composition of this invention effectively causes this bead to flow by spraying the composition onto the revolving edge bead. Thus the resist thickness is substantially uniform across the wafer surface. The hexa-alkyl disilazane increases the composition solubility.

After the resist composition solution is coated onto the substrate, the substrate is temperature treated at approximately 20° to 105° C. This temperature treatment is selected in order to reduce and control the concentration of residual solvents in the photoresist through evaporation while not causing substantial thermal degradation of the photosensitizer. In general one desires to minimize the concentration of solvents and thus this temperature treatment is conducted until a substantial amount of the solvents has evaporated and a thin coating of photoresist composition, on the order of a micron in thickness, remains on the substrate. This treatment is normally conducted at temperatures in the range of from about 20° C. to about 105° C.

The exposed resist-coated substrates are usually developed by immersion in an aqueous alkaline developing solution. The solution is preferably agitated, for example, by nitrogen burst agitation. Suitable developers non-exclusively include water solutions containing an alkali hydroxide, ammonium hydroxide or tetramethyl ammonium hydroxide.

The present composition is exceptionally useful as a photoresist remover, stripper or cleaner by applying the composition to either exposed or unexposed, i.e. cured or uncured photoresist on surfaces or substrates.

The composition is also an effective photoresist adhesion promoter. That is, when applied to a substrate and dried to a tack free state, the adhesion of a subsequently applied photoresist composition is substantially enhanced.

The following specific examples will provide detailed illustrations of the present invention. These examples are not intended, however, to limit or restrict the scope of the invention in any way and should not be construed as providing conditions, parameters or values which must be utilized exclusively in order to practice the present invention.

EXAMPLES

A resist formulation is prepared as follows:
23.8% binder resin
7.0% photoactive compound
69.2% solvent composition comprising Cellosolve acetate, n-butyl acetate and xylene in a ratio of 8:1:1
The binder resin is a cresol-formaldehyde novolak.

The photoactive compound is the condensation product of 2,1-diazonapthoquinone-5-sulfonyl chloride and 1,2,3-trihydroxy-benzophenone.

The resist is coated on a silicon wafer, imagewise exposed and developed. One notices a registration error in the exposing pattern and removes the entire resist coating from the wafer by immersion in a 1:1 mixture of propylene glycol methyl ether and propylene glycol methyl ether acetate in which is blended with 10% by weight of hexamethyl disilazane.

What is claimed is:

1. A composition suitable for stripping, thinning, cleaning or promoting the adhesion of cured and uncured photoresist compositions on substrates covered with such resists which consists essentially of in admixture from about 3 to about 50% by weight of the composition of a hexa-alkyl disilazane and from about 50 to about 97% by weight of the composition of a solvent composition which comprises one or more compounds selected form the group consisting of a propylene glycol monoalkyl ether and a propylene glycol mono-alkyl ether acetate.

2. The composition of claim 1 wherein said acetate is propylene glycol methyl ether acetate.

3. The composition of claim 1 wherein said ether is propylene glycol methyl ether.

4. The composition of claim 1 wherein said hexa-alkyl disilazane is hexa-methyl disilazane.

5. The composition of claim 1 wherein said hexa-alkyl disilazane is present in an amount of from about 5% to abut 30% by weight.

6. The composition of claim 1 wherein said solvent composition is present in an amount of from abut 50% to about 97% by weight.

7. The composition of claim 1 wherein said solvent composition is present in an amount of from about 70% to about 95% by weight.

8. The composition of claim 1 wherein both said ether and said acetate are present and are in a ratio of from about 1:10–10:1.

9. The composition of claim 8 wherein said ratio is from about 7:3–3:7.

10. The composition of claim 8 wherein said ratio is about 1:1.

* * * * *